US008643528B1

(12) United States Patent
Hu et al.

(10) Patent No.: US 8,643,528 B1
(45) Date of Patent: Feb. 4, 2014

(54) ANALOG-TO-DIGITAL CONVERTER

(75) Inventors: Yue Hu, Corvallis, OR (US); Ajay Kumar, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 28 days.

(21) Appl. No.: 13/565,399

(22) Filed: Aug. 2, 2012

(51) Int. Cl.
*H03M 1/12* (2006.01)
*H03M 3/02* (2006.01)
(52) U.S. Cl.
USPC ............ 341/166; 341/143; 341/155; 341/164
(58) Field of Classification Search
USPC .......... 341/143, 155, 164, 165, 166, 167, 168
See application file for complete search history.

(56) References Cited

U.S. PATENT DOCUMENTS

| 6,642,874 B1* | 11/2003 | Lin et al. ....................... 341/143 |
| 6,696,998 B2 | 2/2004 | Ying et al. |
| 2003/0080888 A1* | 5/2003 | Muhammad et al. ......... 341/143 |
| 2011/0285568 A1* | 11/2011 | Harpe ........................... 341/158 |

OTHER PUBLICATIONS

Prefasi, E et al., Second-Order Multi-Bit ΣΔ0 ADC using a Pulse-Width Modulated DAC and an Integrating Quantizer, 16th IEEE International Conference on Electronics, Circuits, and Systems, ICECS 2009, IEEE Dec. 13-16, 2009, pp. 37-40.*
N. Maghari et al., Noise-shaped integrating Quantisers in Delta Sigma modulators, Electronics Letters, Jun. 2009, vol. 45 No. 12.*
P. Harpe et al., A 0.8-mW 5-bit 250-MS/s Time-Interleaved Asynchronous Digital Slope ADC, IEEE Journal of Solid-State Circuits, vol. 46, No. 11, Nov. 2011 pp. 2450-2457.*
Nima Maghari, UN-KU Moon, "A Third-Order Delta Sigma Modulator Using Noise-Shaped Bidirectional Single-Slope Quantizer", ISSCC Dig. Tech. Papers, Feb. 2011, pp. 474-476.
Y. Hu, N. Maghari, T. Musah, U. Moon, "Time-interleaved noise-shaping integrating quantisers," Electronics Letters, May 2010, vol. 46, No. 11, pp. 757-758.

* cited by examiner

*Primary Examiner* — Howard Williams
(74) *Attorney, Agent, or Firm* — John R. Pessetto; Wade J. Brady, III; Frederick J. Telecky, Jr.

(57) ABSTRACT

An analog-to-digital converter (ADC) comprises a plurality of time-interleaved integrating ADCs having feedback from an integrated output signal. In variations, the time-interleaved integrating ADCs have feedback compensation from at least one measure of quantization error. The time-interleaved integrating ADCs may also share a single comparator and may also share a single current source.

20 Claims, 5 Drawing Sheets

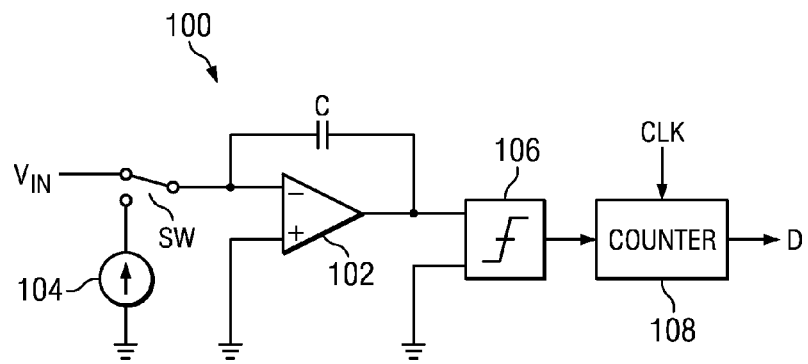
FIG. 1
*(PRIOR ART)*
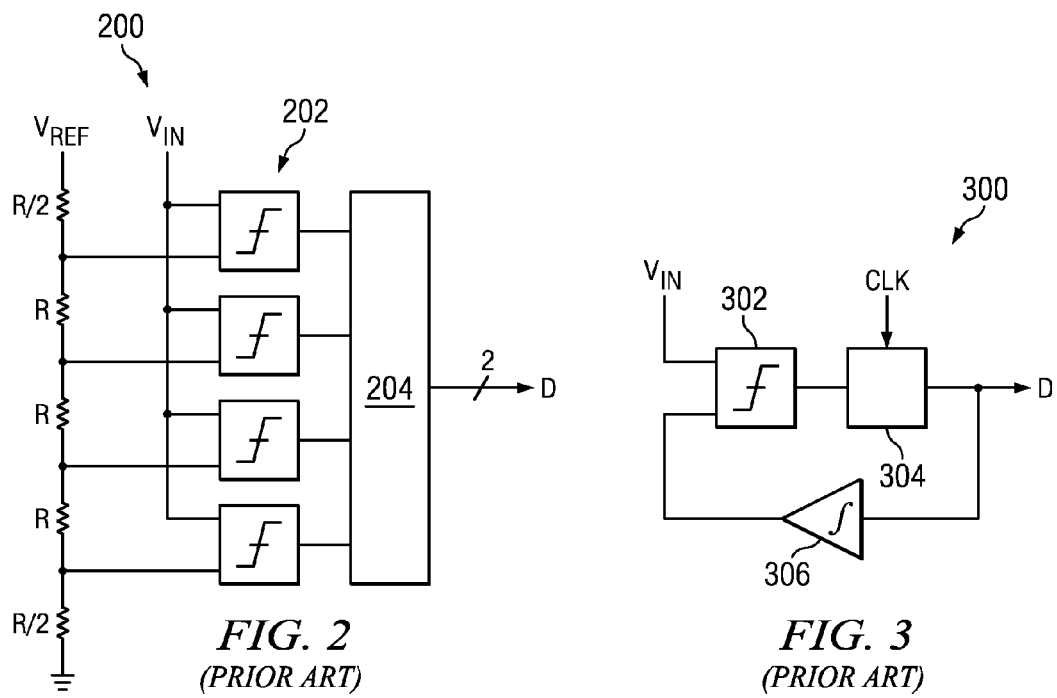
FIG. 2
*(PRIOR ART)*
FIG. 3
*(PRIOR ART)*
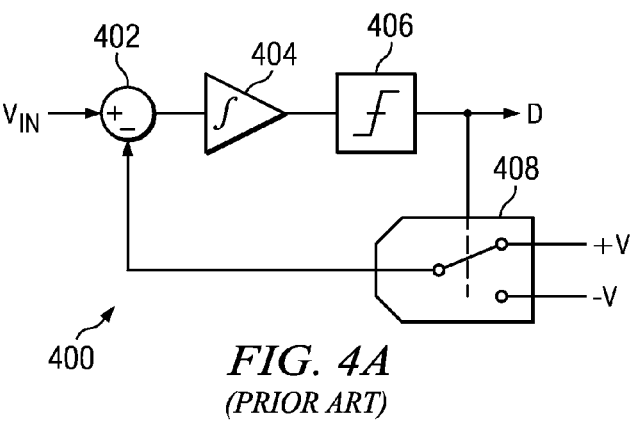
FIG. 4A
*(PRIOR ART)*

ANALOG-TO-DIGITAL CONVERTER

BACKGROUND

An analog-to-digital converter (ADC) converts an analog signal to a digital signal. The analog input signal may be static or may be a dynamic waveform. The digital output signal may be a multi-bit binary number or a sequence of pulses. There are many types of ADC's, with each type having many variations and enhancements. The following background discussion outlines four types of prior art ADC's.

FIG. 1 illustrates an example of a class of ADCs called integrating ADCs. The particular embodiment of FIG. 1 is sometimes called a Wilkenson ADC, but there are variations, for example, dual-slope integrating ADCs. A switch $S_W$ switches one side of a capacitor C (and the input of an operational amplifier 102) between a current source 104 and an input voltage $V_{IN}$. $S_W$ initially switches capacitor C (and the input of the operational amplifier) to $V_{IN}$, and the capacitor C charges to $V_{IN}$. Then $S_W$ switches the capacitor C (and an input of the operational amplifier) to the current source, and the capacitor discharges linearly. A comparator 106 determines when the output of the operational amplifier reaches zero. A counter 108 counts clock pulses from the time the current source starts discharging the capacitor until the time the comparator indicates the capacitor has discharged. A maximum input voltage will result in a known maximum count of clock pulses. The digital output D is the multi-bit binary value of the digital counter 108.

FIG. 2 illustrates a flash ADC 200. A reference voltage $V_{REF}$ is divided by a resistor ladder. An input voltage $V_{IN}$ is compared to each fraction of $V_{REF}$ by a bank of comparators 202. Digital logic circuit 204 converts the comparator outputs to a multi-bit binary value D.

FIG. 3 illustrates a delta-modulator (or ADC) 300. An input voltage $V_{IN}$ is compared to a feedback signal by a comparator 302. If the output of the comparator is high, a clock generates a pulse at the output of a flip-flop 304. If the output of the comparator is low, no pulse is generated. An integrator 306 provides the feedback signal as a scaled running average of the flip-flop output pulses. The digital output D is a series of pulses, and the number of pulses per unit of time represents the value of $V_{IN}$.

FIG. 4A illustrates a sigma-delta ADC 400. An input voltage $V_{IN}$ is summed with a feedback voltage at a summing junction 402. The difference between $V_{IN}$ and the feedback voltage is integrated by an integrator 404. A comparator 406 compares the output of the integrator to ground. If the output of the integrator is positive, the comparator output is high. If the output of the integrator is negative, the comparator output is zero. The output of the comparator is converted to an analog voltage for feedback by a digital-to-analog converter (DAC) 408. In FIG. 4, the DAC 408 is depicted as a switch. If the output of the comparator is high, the switch selects +V as the feedback signal. If the output of the comparator is zero, the switch selects −V as the feedback signal. The integral of the feedback signal over time is equal to $V_{IN}$. The digital output D is a series of binary transitions, and the average value of the binary output per unit of time represents the value of $V_{IN}$.

For a sigma-delta ADC as in FIG. 4A, there are two common ways to improve signal-to-noise: (1) adding additional integration stages, and (2) using a multi-bit quantizer (another ADC) instead of a single-bit comparator. Both of these enhancements are illustrated in FIG. 4B. In FIG. 4B, an input signal $V_{IN}$ is summed with a feedback signal at a summing junction 410, and the difference is integrated by a first integrator 412. The output of the first integrator is also summed with the feedback signal by a summing junction 414, and the difference is integrated by a second integrator 416. Each integration stage is called an order, so the ADC in FIG. 4B is a second-order sigma-delta ADC. In contrast to the binary output comparator 406 in FIG. 4A, in the ADC in FIG. 4B the output of the second integrator is quantized by a multi-bit flash ADC 418 (as in FIG. 2). The multi-bit output of the flash ADC 418 controls a DAC 420. In FIG. 4B, DAC 420 is depicted as a switch that selects from more than two fixed voltages (four are depicted as an example) for a feedback signal. Because of the multi-bit quantizer 418, the ADC in FIG. 4B is a second-order multi-bit sigma-delta ADC.

All ADC's have some level of noise in the output signal, some quantization error (the difference between the analog input and the digitized signal), some non-linearity (the output is not a perfectly linear function of the input), other imperfections inherent in the conversion process, and imperfections resulting from imperfect components. There is an ongoing need for improved signal-to-noise, reduced quantization error, reduced power consumption, and reduced cost for ADC's.

BRIEF DESCRIPTION OF THE DRAWINGS

FIG. 1 is a block diagram illustrating an example prior art embodiment of an integrating ADC.

FIG. 2 is a block diagram illustrating an alternative example prior art embodiment of a flash ADC.

FIG. 3 is a block diagram illustrating an alternative example prior art embodiment of a delta modulator.

FIG. 4A is a block diagram illustrating an alternative example prior art embodiment of a sigma-delta ADC.

DETAILED DESCRIPTION

Figure 4B:
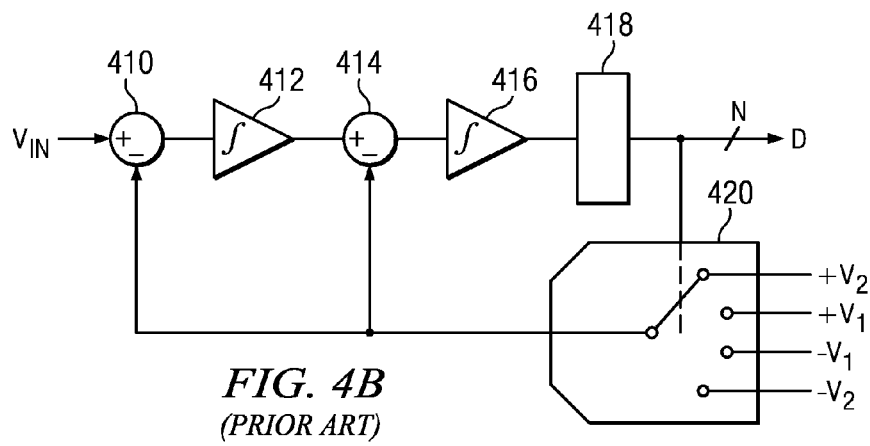
FIG. 4B is a block diagram illustrating an alternative example embodiment of the sigma delta ADC of FIG. 4A.

For a sigma-delta ADC as in FIG. 4A, two common ways to improve signal-to-noise are: (1) adding additional orders and (2) using a multi-bit quantizer. Higher orders can have stability issues, which leads to more complexity to ensure stability. A multi-bit quantizer implemented as a flash ADC as in FIG. 2 needs $2^n$ comparators for an n-bit output (or $2^n-1$ comparators in some designs). The comparators can take up substantial integrated die space and consume a substantial amount of power. In the following description, an ADC will be described that has a general functional block diagram that is similar to that of a multi-order multi-bit sigma-delta ADC, but it has the same or better signal-to-noise ratio than a conventional sigma-delta ADC with a higher number of orders, and it has a multi-bit quantizer that only requires a single comparator and no operational amplifiers.

Figure 5A:
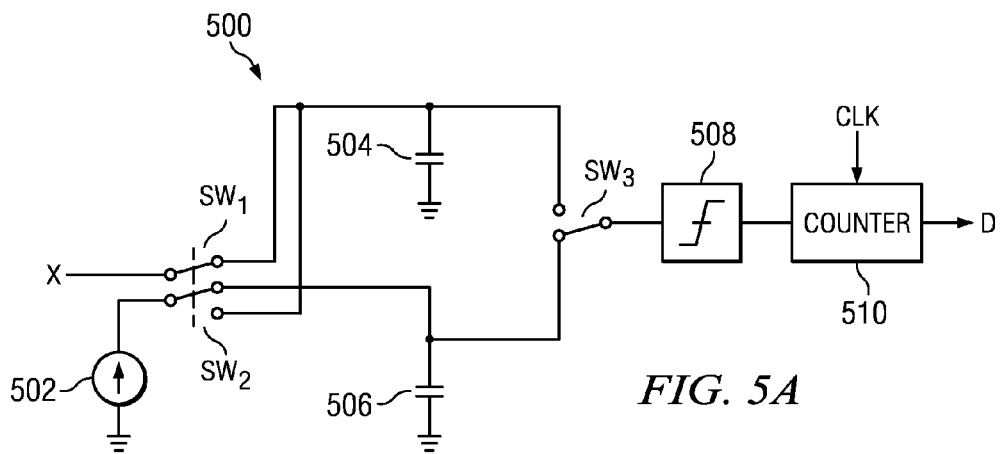
FIG. 5A is a block diagram illustrating an example embodiment of a time-interleaved quantizer.

First, consider the quantizer. In the following description, instead of using a flash ADC for a multi-bit quantizer, a time-based quantizer is used, based on integrating ADCs as in FIG. 1. The integrating ADC illustrated in FIG. 1 requires a first time period to charge the capacitor, and a second time period to discharge the capacitor. The overall time for one digital output is the sum of the two time periods. The overall conversion rate can be approximately doubled by time-interleaving two integrating ADC's, with opposite switching cycles, so that while the first ADC is charging the second ADC is discharging, and while the second ADC is charging the first ADC is discharging. FIG. 5A illustrates a quantizer 500 which is effectively two time-interleaved integrating ADC circuits, with opposite switching cycles, and sharing a single comparator and a single current source. With the switches ($SW_1$, $SW_2$, $SW_3$) in the positions illustrated in FIG. 5A, a first capacitor 504 is being charged to an input voltage X, a second capacitor 506 is being discharged by a current source 502, and the voltage on capacitor 506 is switched to a comparator 508. When the switches are in their opposite positions, capacitor 506 is being charged to the input voltage X, capacitor 504 is being discharged, and the voltage on capacitor 504 is switched to the comparator 508. For each capacitor being discharged, a counter 510 counts clock pulses during the discharge time and the digital value of the counter is the digital output D. Comparing FIG. 5A to FIG. 1, note that the operational amplifier 102 in FIG. 1 has been eliminated, and voltage X directly charges capacitor 504 or capacitor 506, and the current source 502 in FIG. 5A directly discharges capacitor 504 or capacitor 506.

Figure 5B:
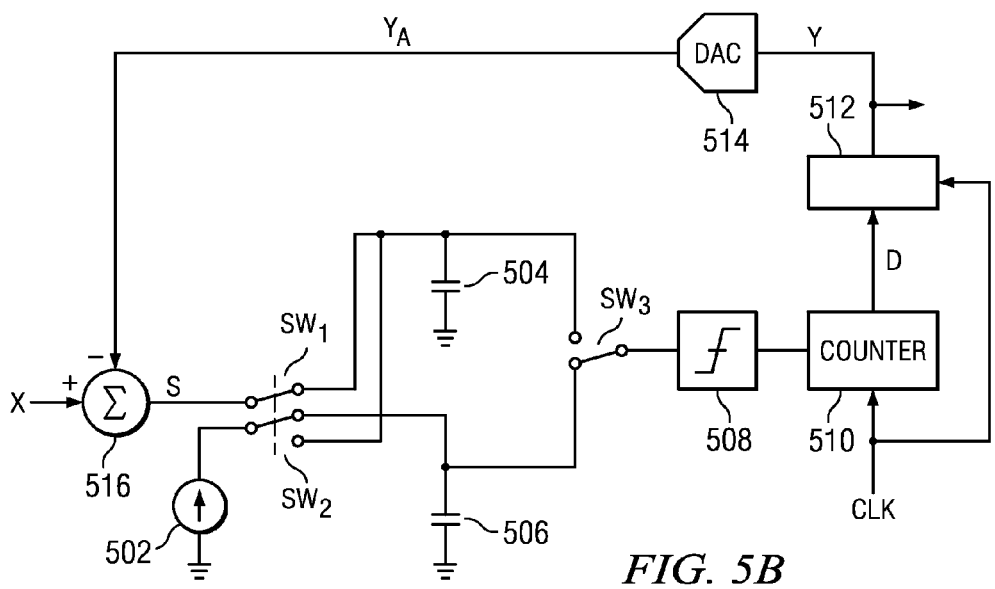
FIG. 5B is a block diagram illustrating an alternative example embodiment of the time-interleaved quantizer of FIG. 5A.

An integrating ADC as illustrated in FIG. 1 needs an ideal current source. A transistor current source is sensitive to the voltage across the current source, which decreases linearity and increases noise. In addition, a capacitor being directly discharged by a current source, as in FIG. 5A, may be more non-linear than the operational amplifier implementation of FIG. 1. In FIG. 5B, two time-interleaved integrating ADCs are used as in FIG. 5A, and for each ADC, feedback is used to reduce the voltage being converted, which improves the linearity of the non-ideal transistor current source directly discharging a capacitor. In FIG. 5B, digital value Y is the value of a digital circuit 512, where circuit 512 is effectively a digital integrator. Circuit 512 computes $Y(N)=Y(N-1)+D(N)$. Y(N) is converted to an analog voltage $Y_A$ by a DAC 514, and the resulting analog voltage is subtracted from $X(N+1)$ by a summing junction 516. The capacitor being charged charges to the value of S, the output of the summing junction 516. Initially, D=0 and Y=0. After one ADC cycle, $Y(1)=Y(0)+D(1)$, which is just D(1). Then, for each ADC cycle N, the capacitor being charged charges to $S(N)=X(N)-Y_A(N-1)$, which is a small difference if X is highly oversampled. In the embodiment of FIG. 5B, the counter 510 is measuring the relative small value of the output S of the summing junction, the value of D is typically small, and the digital output of the quantizer is then the integrated digital signal Y. In the steady state, since the current source 502 is only discharging the small difference between X(N) and $Y_A(N-1)$, the linearity of the current source directly discharging the capacitor is significantly improved. Functionally, the feedback signal is a delta-modulation signal as in FIG. 3, but it is being implemented in a time-interleaved integrating ADC which in turn is being used as a quantizer in a sigma-delta ADC.

Figure 6A:
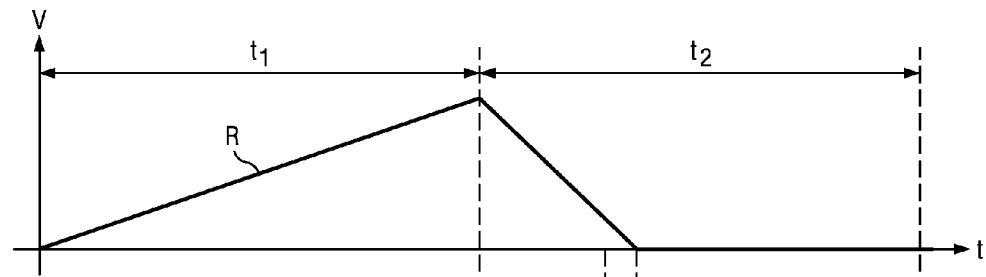
FIG. 6A is a timing diagram illustrating a voltage output of an integrating ADC.
Figure 6B:
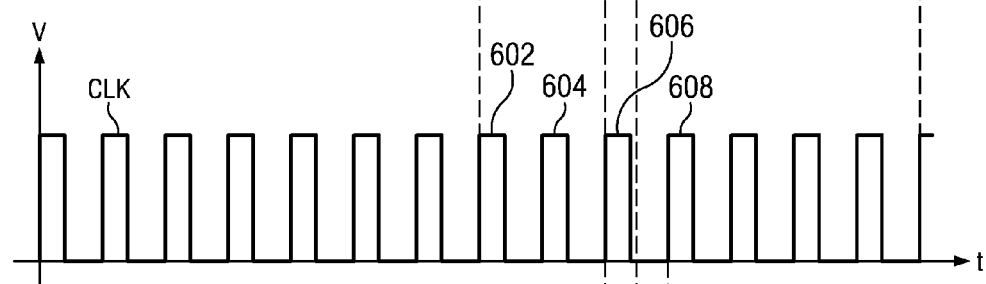
FIG. 6B is a timing diagram of clock pulses associated with the integrating ADC of FIG. 6A.
Figure 6C:
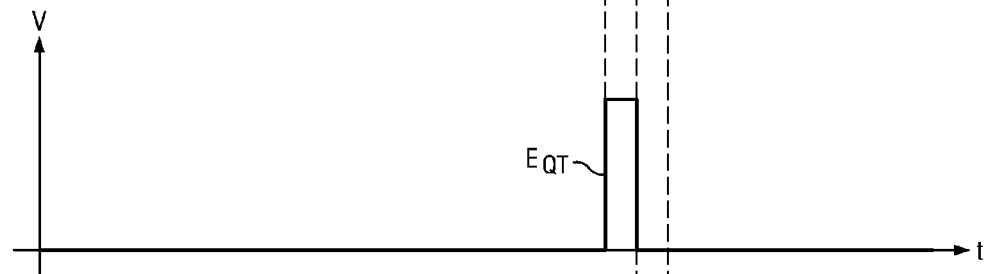
FIG. 6C is a timing diagram illustrating an example embodiment of a measure of quantization error for the voltage output of FIG. 6A and the clock pulses of FIG. 6B.
Figure 6D:
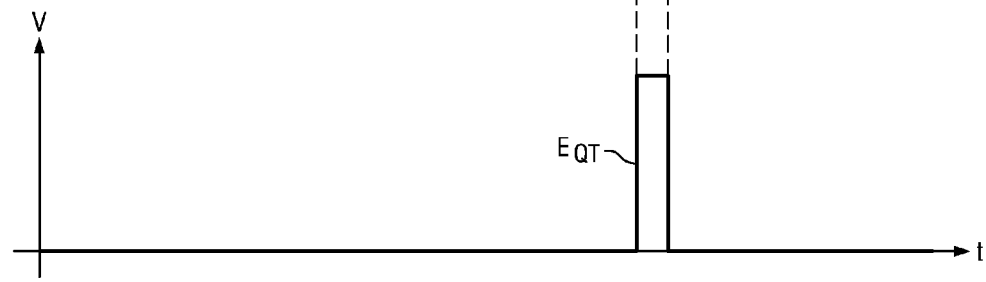
FIG. 6D is a timing diagram illustrating an alternative example embodiment of a measure of quantization error for the voltage output of FIG. 6A and the clock pulses of FIG. 6B.

The circuit of FIG. 5B has some finite quantization error. This is illustrated in FIGS. 6A-6D. In FIG. 6A, during time $t_1$ a capacitor (504 or 506) is charged to the input voltage $S(N)=X(N)-Y_A(N-1)$. During time $t_2$ the capacitor is discharged and the counter 510 (FIGS. 5A, 5B) counts clock pulses until the capacitor is discharged. Time $t_2$ is the time required for the counter to count to the maximum digital value. For example, for a 3-bit quantizer, $t_2$ is the duration of seven clock cycles. In the example of FIG. 6B, the counter counts three clock pulses 602, 604, and 606 and then the capacitor is discharged to zero before a fourth clock pulse is received. The counter has a value of three, but the actual value should be between three and four. In FIG. 6C, the time from when the third pulse is received by the counter until the time the capacitor discharges to zero (as detected by the comparator, FIGS. 5A & 5B, 508) is a measure of the quantization error $E_{QT}$. The pulse illustrated in FIG. 6C may be added at the summing junction (FIG. 5B, 516) to the output of the DAC (FIG. 5B, 514) as a compensation for quantization error. However, at the time the pulse in FIG. 6C needs to be generated (when the third pulse is generated) it is not known that the zero crossing will occur before the fourth pulse. As an alternative, in FIG. 6D, a pulse is generated at the time the capacitor discharges to zero, and ends at the beginning of the next clock pulse 608. The counter (FIG. 5B, 510) then reports one extra count (in the example of FIGS. 6A and 6B it would report a count of four instead of a count of three). Then the DAC output is slightly too large and the pulse illustrated in FIG. 6D can be subtracted from the output of the DAC as a compensation for quantization error.

Figure 7:
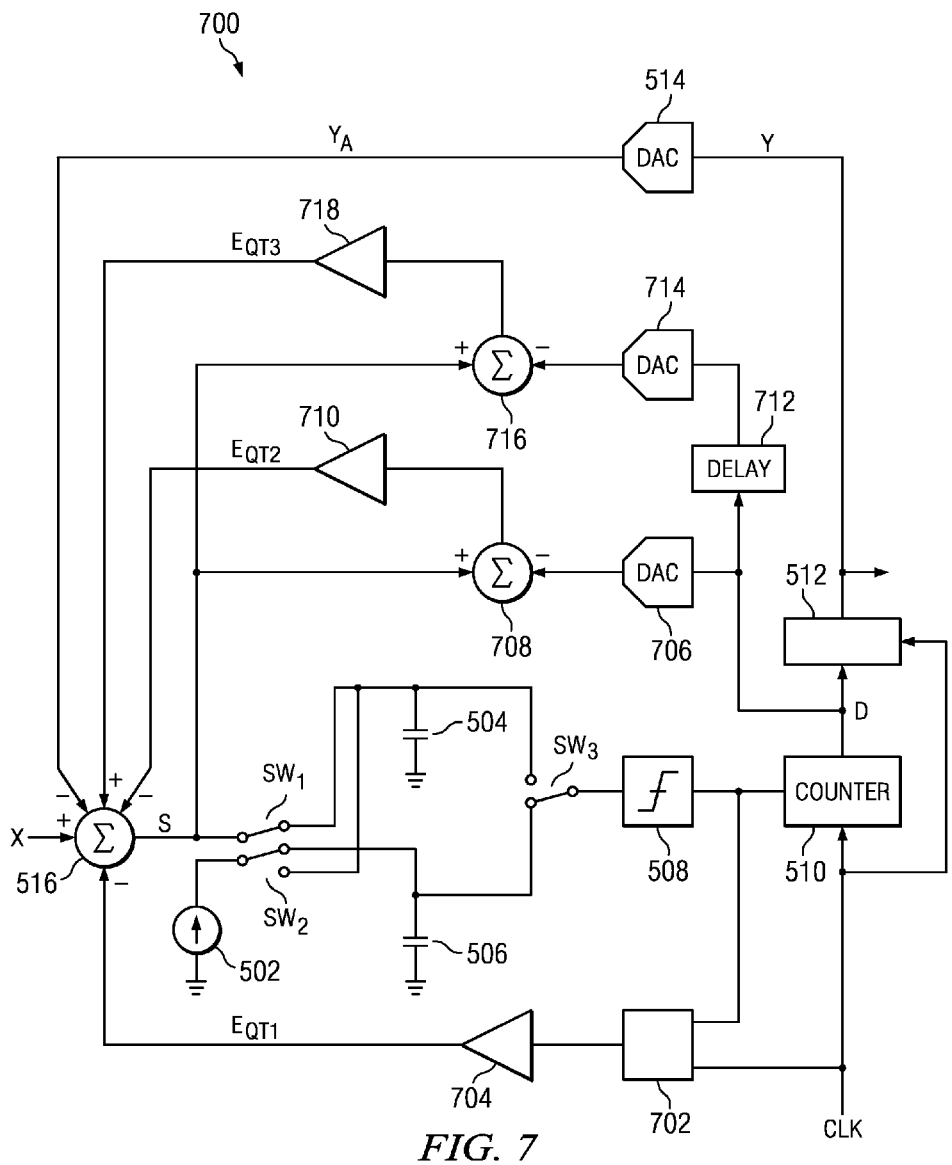
FIG. 7 is a block diagram illustrating an alternative example embodiment of the quantizer of FIG. 5B.

FIG. 7 illustrates a quantizer 700, which is the quantizer of FIG. 5B further modified to compensate for quantization errors with three quantization error feedback signals. Another measure of quantization error is the difference between the voltage being digitized (S) and the analog value of the resulting digitized value (analog value of D). When the switches are in the positions illustrated in FIG. 7, at the end of the conversion cycle, capacitor 504 is charged to S(N) and D is the digital value of S(N−1). Then the switches are reversed and capacitor 506 is charged to S(N+1) and D is the digital value of S(N). The role of the capacitors flip back and forth in a time interleaved manner. If the input signal X is highly oversampled then the input signal X does not change substantially from one sample to the next and an approximate measure of quantization error is S(N) minus the analog value of D(N−1). Still another approximate measure of quantization error is S(N) minus the analog value of D(N−2).

In FIG. 7, there are four different circuits that reduce quantization noise. First, quantization noise is reduced by providing a multi-bit digitally integrated feedback (digital integrator 512, DAC 514) to the signal swing at the input of the quantizer, as described in the discussion of FIG. 5b. Second, there is an analog (variable pulse width) quantization error feedback circuit (702, 704) as described in the discussion of FIG. 6D. Then there are two additional quantization error feedback circuits (706, 708, 710; and 712, 714, 716, 718) based on the differences over time between the output of the summing junction (signal S) and the digital value of signal S (digital value D). Together, reducing the input signal swing plus three quantization error feedback signals provides two additional orders of noise shaping to a multi-bit quantizer so that a simpler, cheaper quantizer with a simple current source and capacitor can be used.

In FIG. 7, a first quantization error signal $E_{QT1}$ is a variable width pulse generated by circuit 702 and amplifier 704. Circuit 702 generates a variable width pulse as illustrated in FIG.

6D. This analog variable width pulse ($E_{QT1}$), as weighted by amplifier 704, is subtracted from the input signal X at summing junction 516. Note that the value of D in FIG. 7 is one more than the value of D in FIG. 5B. For example, counter 510 in FIG. 7 may be reset to a value of one instead of being reset to a value of zero. A second quantization error signal $E_{QT2}$ is an analog voltage which is S(N)−D(N−1). Digital output D is converted to an analog voltage by a DAC 706, subtracted from S at a summing junction 708, and the resulting difference is weighted by an amplifier 710. A third quantization error signal $E_{QT3}$ is an analog voltage which is S(N)−D(N−2). Digital output D is delayed by one-half clock cycle by a delay circuit 712, converted to an analog voltage by a DAC 714, subtracted from S at a summing junction 716, and the resulting difference is weighted by an amplifier 718. In the sample (Z) domain, the three quantization error feedback signals are in the form of $E_{QT}(1-2Z^{-1}+Z^{-2})$. As an overall result, the capacitor being charged charges to a value of $S(N)=X(N)-Y_A(N-1)+E_{QT1}-E_{QT2}+E_{QT3}$.

Figure 8:
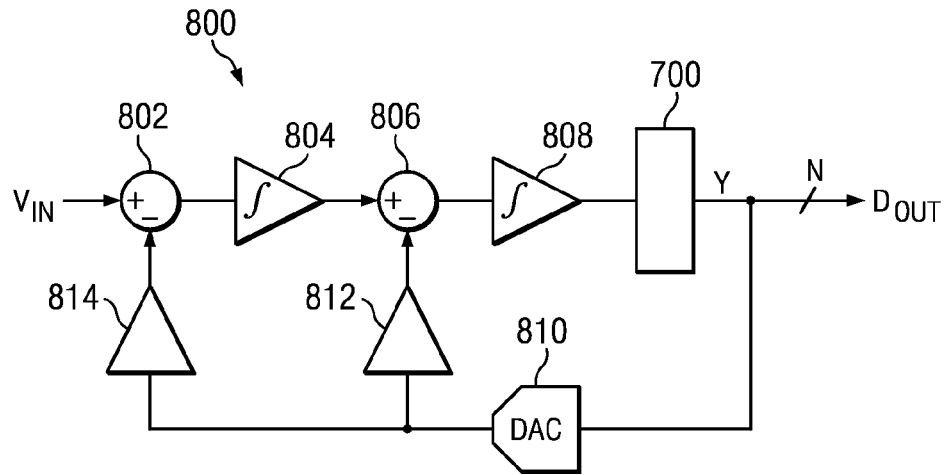
FIG. 8 is a block diagram illustrating an example embodiment of a sigma-delta ADC using the quantizer of FIG. 7.

FIG. 8 illustrates a sigma-delta ADC with the quantizer of FIG. 7. In FIG. 8, an analog input voltage $X_{IN}$ is summed with a feedback signal at a first summing junction 802. The resulting difference is integrated by a first integrator 804. The output of integrator 804 is summed with a feedback signal at a second summing junction 806. The resulting difference is integrated by a second integrator 808. The output of integrator 808 is digitized by a quantizer 700 as in FIG. 7. The N-bit digital output $D_{OUT}$ in FIG. 8 is the integrated digital value Y in FIG. 7. A DAC 810 converts the digital output $D_{OUT}$ to an analog signal, and provides the feedback signal as weighted by amplifiers 812 and 814. The sigma-delta ADC of FIG. 8 has two integration stages as in the second-order sigma-delta ADC of FIG. 4B, but the quantizer 700 of FIG. 8, with input swing reduction and with quantization error correction from the current input and from two previous inputs, provides a signal-to-noise ratio equivalent to a fourth-order sigma-delta ADC (given the same number of levels of quantization by the quantizer), shapes the noise to much higher frequencies than a flash ADC, and does so with a single comparator in the quantizer and no operational amplifiers in the quantizer.

Figure 9:
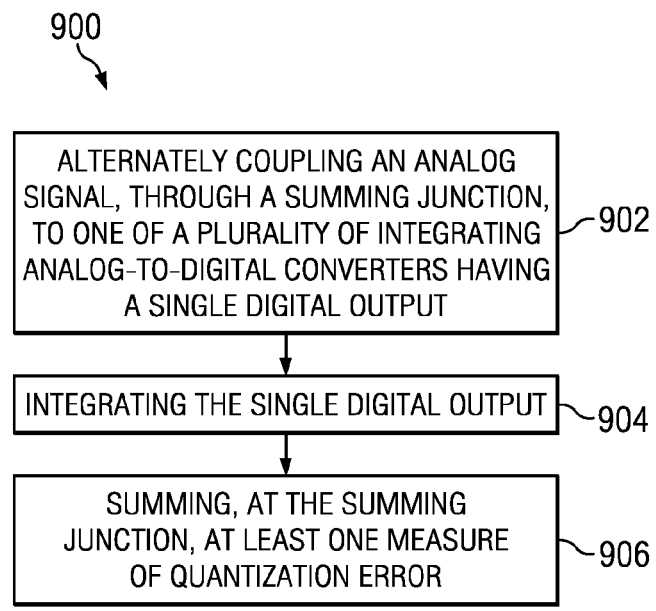
FIG. 9 is a flow chart illustrating an example embodiment of a method for quantizing a signal.

FIG. 9 illustrates a method 900 for converting an analog signal to a digital signal. Note that the steps do not necessarily occur in the order depicted in the flow chart, steps may occur simultaneously, and not all the steps depicted in the flow chart are necessarily essential. At step 902, the analog signal is alternately coupling through a summing junction to one of a plurality of integrating analog-to-digital converters having a single digital output. At step 904, the single digital output is integrated. At step 906, the value of the integrated digital output is summed at the summing junction. Note that the terms "summing" or "summed" may refer to summing positive or negative values, and may include both addition and subtraction.

What is claimed is:

1. An analog-to-digital converter (ADC) receiving an analog input signal, the ADC comprising:
   a summing junction receiving the analog input signal and having an output;
   a plurality of time-interleaved integrating ADCs receiving the output of the summing junction and having a single digital output;
   an integrator integrating the digital output; and
   the summing junction receiving the integrated digital output.

2. The ADC of claim 1, further comprising:
   a counter;
   a digital integrator integrating the digital value of the counter;
   a digital-to-analog converter (DAC) receiving an output of the digital integrator and having an analog output; and
   the summing junction receiving the analog output of the DAC.

3. The ADC of claim 1, further comprising:
   the summing junction further receiving at least one measure of quantization error.

4. The ADC of claim 3, further comprising:
   a current source discharging a capacitance;
   one measure of quantization error further comprising:
   a voltage pulse having a pulse width that is the difference in time between a start of a clock pulse and a time when the capacitance is discharged.

5. The ADC of claim 3, further comprising:
   a counter;
   one measure of quantization error further comprising:
   a difference between the output of the summing junction and the value of the counter.

6. The ADC of claim 1, further comprising:
   the time-interleaved integrating ADCs sharing a single comparator.

7. The ADC of claim 1, further comprising:
   the time-interleaved integrating ADCs sharing a single current source.

8. The ADC of claim 1, each integrating ADC having an integrator comprising a capacitor charged by a current source without an operational amplifier.

9. A sigma-delta ADC, comprising:
   at least one integration stage followed by a quantizer;
   the quantizer comprising a plurality of time-interleaved integrating ADCs sharing a single comparator.

10. The sigma-delta ADC of claim 9, further comprising:
    the time-interleaved integrating ADCs sharing a single current source.

11. The sigma-delta ADC of claim 9, each integrating ADC having an integrator comprising a capacitor charged by a current source without an operational amplifier.

12. The sigma-delta ADC of claim 9, the quantizer further comprising:
    a summing junction receiving an output of the integration stage;
    a counter counting clock pulses during a time period controlled by the single comparator;
    an integrator integrating a digital output of the counter; and
    the summing junction receiving the integrated digital output.

13. The sigma-delta ADC of claim 12, the quantizer further comprising:
    a counter;
    a digital integrator integrating the digital value of the counter;
    a digital-to-analog converter (DAC) receiving an output of the digital integrator and having an analog output; and
    the summing junction receiving the analog output of the DAC.

14. The sigma-delta ADC of claim 12, the quantizer further comprising:
    the summing junction further receiving at least one measure of quantization error.

15. The sigma-delta ADC of claim 14, one measure of quantization error further comprising:
    a difference between the output of the summing junction and the value of the counter.

16. The sigma-delta ADC of claim 14, further comprising:
    a current source discharging a capacitance;

one measure of quantization error further comprising:
a voltage pulse having a pulse width that is the difference in time between a start of a clock pulse and a time when the capacitance is discharged.

17. A method for converting an analog signal to a digital signal, comprising:
alternately coupling the analog signal, through a summing junction, to one of a plurality of integrating analog-to-digital converters having a single digital output;
integrating the single digital output; and
summing, at the summing junction, the value of the integrated digital output.

18. The method of claim 17, further comprising:
summing, at the summing junction, at least one measure of quantization error.

19. The method of claim 18, further comprising:
measuring the difference between an output of the summing junction and a value of the single digital output; and
summing, at the summing junction, the difference.

20. The method of claim 18, further comprising:
detecting when a current source has discharged a capacitance;
generating a voltage pulse that starts when the current source has discharged a capacitance and ends when a next clock pulse begins; and
summing, at the summing junction, the voltage pulse.

* * * * *